United States Patent
Uto

(10) Patent No.: US 11,476,829 B2
(45) Date of Patent: Oct. 18, 2022

(54) SUBSTRATE FOR SURFACE ACOUSTIC WAVE DEVICE, AND PSEUDO SURFACE ACOUSTIC WAVE ELEMENT

(71) Applicant: KYOCERA Corporation, Kyoto (JP)

(72) Inventor: Takashi Uto, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 690 days.

(21) Appl. No.: 16/486,696

(22) PCT Filed: Feb. 27, 2018

(86) PCT No.: PCT/JP2018/007205
§ 371 (c)(1),
(2) Date: Aug. 16, 2019

(87) PCT Pub. No.: WO2018/159596
PCT Pub. Date: Sep. 7, 2018

(65) Prior Publication Data
US 2019/0372550 A1 Dec. 5, 2019

(30) Foreign Application Priority Data

Feb. 28, 2017 (JP) .............................. JP2017-035771

(51) Int. Cl.
*H03H 9/02* (2006.01)
*H03H 9/25* (2006.01)
*H03H 9/64* (2006.01)
*C30B 29/30* (2006.01)
*H03H 3/08* (2006.01)

(52) U.S. Cl.
CPC ......... *H03H 9/02559* (2013.01); *C30B 29/30* (2013.01); *H03H 3/08* (2013.01); *H03H 9/02157* (2013.01); *H03H 9/02842* (2013.01); *H03H 9/25* (2013.01); *H03H 9/6489* (2013.01)

(58) Field of Classification Search
CPC .......... H03H 9/02559; H03H 9/02157; H03H 9/02842; H03H 9/25; H03H 9/6489; H03H 3/08; C30B 29/30
See application file for complete search history.

(56) References Cited

U.S. PATENT DOCUMENTS

| 4,412,886 A | 11/1983 | Sakaguchi et al. |
| 2014/0145558 A1* | 5/2014 | Hori ...................... H01L 41/312 310/313 R |

FOREIGN PATENT DOCUMENTS

| JP | S58-176802 A | 10/1983 |
| JP | H11-88107 A | 3/1999 |
| JP | 2003-110390 A | 4/2003 |
| JP | 2014-147054 A | 8/2014 |

\* cited by examiner

*Primary Examiner* — Samuel S Outten
(74) *Attorney, Agent, or Firm* — Procopio Cory Hargreaves and Savitch LLP

(57) ABSTRACT

A substrate for a surface acoustic wave device is constituted of a piezoelectric material and includes a first surface on which a surface acoustic wave propagates, and a second surface located opposite to the first surface. The second surface has an arithmetic mean roughness (Ra) of 0.2 μm to 0.4 μm, and there is satisfied either of the relationship between the arithmetic mean roughness (Ra) and mean spacing (S) of local peaks of Ra/S≥11, and the relationship between the arithmetic mean roughness (Ra) and mean spacing (Sm) of irregularities of Ra/Sm≥6.7. Further, the second surface has a maximum height (Rmax) of 2.5 μm to 4.5 μm, and there is satisfied either of the relationship between the maximum height (Rmax) and mean spacing (S) of local peaks of Rmax/S≥130, and the relationship between the maximum height (Rmax) and mean spacing (Sm) of irregularities of Rmax/Sm≥80.

11 Claims, No Drawings

SUBSTRATE FOR SURFACE ACOUSTIC WAVE DEVICE, AND PSEUDO SURFACE ACOUSTIC WAVE ELEMENT

TECHNICAL FIELD

The present disclosure relates to a substrate for a surface acoustic wave device and a pseudo surface acoustic wave element.

BACKGROUND ART

A surface acoustic wave device is a device that converts an electrical signal into a surface acoustic wave to perform signal processing. As a substrate for a surface acoustic wave device, a single crystal substrate such as lithium tantalate or lithium niobate having piezoelectric characteristics is used.

RELATED ART DOCUMENTS

Patent Documents

Patent Document 1: Japanese Unexamined Patent Publication No. 11-88107
Patent Document 2: Japanese Unexamined Patent Publication No. 2003-110390
Patent Document 3: Japanese Unexamined Patent Publication No. 58-176802

SUMMARY OF THE INVENTION

The substrate for a surface acoustic wave device of the present disclosure is constituted of a piezoelectric material, includes a first surface on which a surface acoustic wave propagates and a second surface located opposite to the first surface, and satisfies at least one of (1) to (4) below.

(1) The second surface has an arithmetic mean roughness (Ra) of 0.2 µm to 0.4 µm and the relationship between the arithmetic mean roughness (Ra) and mean spacing (S) of local peaks is $Ra/S \geq 11$.

(2) The second surface has an arithmetic mean roughness (Ra) of 0.2 µm to 0.4 µm, and the relationship between the arithmetic mean roughness (Ra) and mean spacing (Sm) of irregularities is $Ra/Sm \geq 6.7$.

(3) The second surface has a maximum height (Rmax) of 2.5 µm to 4.5 µm, and the relationship between the maximum height (Rmax) and mean spacing (S) of local peaks is Rmax/S 130.

(4) The second surface has a maximum height (Rmax) of 2.5 µm to 4.5 µm, and the relationship between the maximum height (Rmax) and mean spacing (Sm) of irregularities is $Rmax/Sm \geq 80$.

EMBODIMENTS FOR CARRYING OUT THE INVENTION

<Substrate for Surface Acoustic Wave Device>

Hereinafter, a substrate for a surface acoustic wave device of the present disclosure will be described. The substrate for a surface acoustic wave device is constituted of a piezoelectric material substrate having piezoelectric characteristics such as lithium tantalate and lithium niobate. In the present embodiment, an example using a lithium tantalate single crystal as a piezoelectric material will be described. As the lithium tantalate single crystal, a 36° Y to 46° Y lithium tantalate single crystal is preferably used as a pseudo surface acoustic wave device among surface acoustic wave devices. In the present embodiment, a substrate for a pseudo surface acoustic wave device constituted of a 42° Y lithium tantalate single crystal will be described as a substrate.

The substrate for a surface acoustic wave device of the present embodiment includes a first surface which is a surface on which a surface acoustic wave propagates, and a second surface located opposite to the first surface. Note that since the substrate for a surface acoustic wave device is a plate-shaped body having two main surfaces, the first surface can be reworded as a first main surface and the second surface as a second main surface. The substrate for a surface acoustic wave device of the present embodiment satisfies at least one of (1) to (4) below.

(1) The second surface has an arithmetic mean roughness (Ra) of 0.2 µm to 0.4 µm and the relationship between the arithmetic mean roughness (Ra) and mean spacing (S) of local peaks is $Ra/S \geq 11$.

(2) The second surface has an arithmetic mean roughness (Ra) of 0.2 µm to 0.4 µm, and the relationship between the arithmetic mean roughness (Ra) and mean spacing (Sm) of irregularities is $Ra/Sm \geq 6.7$.

(3) The second surface has a maximum height (Rmax) of 2.5 µm to 4.5 µm, and the relationship between the maximum height (Rmax) and mean spacing (S) of local peaks is Rmax/S 130.

(4) The second surface has a maximum height (Rmax) of 2.5 µm to 4.5 µm, and the relationship between the maximum height (Rmax) and mean spacing (Sm) of irregularities is $Rmax/Sm \geq 80$.

As described above, in the substrate for a surface acoustic wave device of the present embodiment, the arithmetic mean roughness (Ra) and the maximum height (Rmax), which are parameters in a height direction of the second surface (direction perpendicular to the surface), are relatively larger than the mean spacing (S) of local peaks and the mean spacing (Sm) of irregularities, which are parameters in a width direction of the second surface (direction in parallel to the surface).

The substrate for a surface acoustic wave device of the present embodiment is used for a surface acoustic wave filter. In the surface acoustic wave filter, an input electrode for excitation and an output electrode for reception are formed on a surface of the substrate for a surface acoustic wave device. When a bulk wave generated when exciting a surface acoustic wave with the input electrode is reflected by the second surface, the output electrode receives a reflected wave that causes spurious (a frequency component that is not intended in design), making it not possible for the surface acoustic wave filter to obtain desired characteristics. Thus, the second surface of the substrate for a surface acoustic wave device is roughened. When the second surface is roughened, the bulk wave is scattered and the reflected wave received by the output electrode is reduced, and thus the spurious caused by the reflected wave is reduced. Currently, in the substrate for a surface acoustic wave device, it is required that the amount of reflected waves from the second surface is small, and the number of defects and residual stress due to roughening is small.

Since the substrate for a surface acoustic wave device of the present embodiment has an arithmetic mean roughness (Ra) and a maximum height (Rmax) that are relatively large, the bulk wave is scattered on the second surface, and the reflected wave received at the output electrode is reduced. Therefore, the spurious caused by the reflected wave is reduced. In addition, since the mean spacing (S) of local peaks and the mean spacing (Sm) of irregularities are relatively small, defects and residual stress in roughening are small. Therefore, warpage and cracks due to defects and residual stress caused by roughening are small.

Further, the mean spacing (S) of local peaks may be 0.0015 μm to 0.025 μm. Moreover, the mean spacing (Sm) of irregularities may be 0.03 μm to 0.05 μm. When such a configuration is satisfied, the reflected wave from the second surface is further reduced, and defects and residual stress due to roughening are also reduced.

In the present description, the maximum height (Rmax) complies with JIS B 0601-1982. The arithmetic mean roughness (Ra), the mean spacing (Sm) of irregularities, and the local peak mean spacing (S) comply with JIS B 0601: 1994.

The pseudo surface acoustic wave element configured to include the substrate for a surface acoustic wave device of the present disclosure has less reflected waves from the second surface and less defects and residual stress due to roughening.

<Method of Manufacturing Substrate for Surface Acoustic Wave Device>

As an example of a method of manufacturing a substrate for a surface acoustic wave device, a method of manufacturing a substrate for a pseudo surface acoustic wave device constituted of a 42° Y lithium tantalate single crystal will be described. First, an ingot constituted of a lithium tantalate single crystal is grown by the Czochralski (CZ) method. A pulling orientation of growth of the ingot is the same as crystal orientations of the first surface and the second surface (both surfaces) of a final substrate for a pseudo surface acoustic wave device.

Note that the crystal orientation may be close to the crystal orientations of both the surfaces of the substrate for a pseudo surface acoustic wave device, such as 38° Y.

The ingot is subjected to end face grinding so that both surfaces have a predetermined crystal orientation as necessary, and subsequently to cylindrical grounding so as to have a diameter similar to a diameter of the substrate for a pseudo surface acoustic wave device. Thereafter, slicing is performed using a multi-wire saw or the like so as to have both sides with a predetermined crystal orientation and to have a predetermined thickness.

Next, lapping is performed in order to reduce warpage caused by slicing and to make the second surface have a desired surface property (lapping step). The second surface after the lapping step has an arithmetic mean roughness (Ra) of 0.15 μm to 0.35 μm, and the relationship between the arithmetic mean roughness (Ra) and the mean spacing (S) of local peaks is Ra/S<11, or the relationship between the arithmetic mean roughness (Ra) and mean spacing (Sm) of irregularities is Ra/Sm<6.7. Alternatively, a maximum height (Rmax) is 2.0 μm to 4.0 μm, and the relationship between the maximum height (Rmax) and mean spacing (S) of local peaks is Rmax/S<130, or the relationship between the maximum height (Rmax) and the mean spacing (Sm) of irregularities is Rmax/Sm<80.

For the lapping, a double-sided lapping machine may be used. For example, using a cast iron platen and a slurry containing #1000 to #2000 GC abrasive grains, processing is performed at a processing pressure of 4.9 kPa (=50 gf/cm$^2$). The processing conditions are not limited to the above conditions as long as a desired rough surface shape can be obtained, and can be changed as appropriate. For example, the processing pressure may be changed during processing, or the first surface and the second surface may be processed one by one.

Next, an etching step is performed. The etching step is performed using a hydrofluoric acid, a nitric acid, or a mixed acid thereof as an etchant. Note that in this etching step, etching is performed so that the second surface has an arithmetic mean roughness (Ra) of 0.2 μm to 0.4 μm, and the relationship between the arithmetic mean roughness (Ra) and mean spacing (S) of local peaks is Ra/S 11, or the relationship between the arithmetic mean roughness (Ra) and mean spacing (Sm) of irregularities is Ra/Sm≥6.7. Alternatively, the etching is performed so that a maximum height (Rmax) is 2.5 μm to 4.5 μm, and the relationship between the maximum height (Rmax) and mean spacing (S) of local peaks is Rmax/S≥130, or the relationship between the maximum height (Rmax) and mean spacing (Sm) of irregularities is Rmax/Sm≥80. Note that it is particularly preferable to perform etching such that the arithmetic mean roughness (Ra) is 0.25 μm to 0.35 μm and the maximum height (Rmax) is 3.0 μm to 4.0 μm.

The etching conditions are, for example, 50 to 120 minutes at 75° C. to 85° C. using a mixed acid in which the mixing ratio of a hydrofluoric acid to a nitric acid is 1:1 by volume. Under such etching conditions, the substrate constituted of a lithium tantalate single crystal is etched by about 1 μm on each of both sides. According to the above-mentioned etching conditions, the mean spacing (S) of local peaks is 0.0015 μm to 0.025 μm, and the mean spacing (Sm) of irregularities is 0.03 μm to 0.05 μm.

Next, the first surface is CMP-polished by chemical mechanical polishing (CMP). The conditions for the CMP are such that a slurry containing colloidal silica as a polishing material is used, a surface pressure load is set to 30 g/cm$^2$ or more, and the first surface is brought into contact with a polishing cloth for polishing. Under such CMP polishing conditions, the shape of the second surface after etching is maintained.

EXAMPLES

Hereinafter, an example of the substrate for a surface acoustic wave device of the present disclosure will be described. A cylindrical lithium tantalate single crystal having a diameter of 108 mm and a length of 100 mm was grown using a single crystal growth furnace of high frequency heating CZ method. This single crystal was cylindrically ground to a diameter of 100 mm with a cylindrical grinder and further sliced using a multi-wire saw to obtain about 150 substrates with a crystal orientation of 42° Y and a thickness of 400 μm. Here, the obtained substrate was lapped by a lapping machine using #1000, #1500, and #2000 abrasive grains to have a thickness of about 250 μm at a processing pressure of 4.9 kPa. The lapped substrate was etched at 75° C. to 85° C. for 60 minutes to 90 minutes using a mixed acid in which the mixing ratio of a hydrofluoric acid to a nitric acid was 1:1 by volume.

As a comparative example, a substrate obtained by slicing and lapping in a manner similar to that of the example was etched at 80° C. for 30 minutes using a mixed acid in which the mixing ratio of a hydrofluoric acid to a nitric acid was 1:1 by volume.

Furthermore, a first surface of the substrate of the example and the comparative example was polished by CMP. The conditions for the CMP were such that a slurry containing colloidal silica with a particle diameter of 30 to 120 nm as a polishing material was used, a surface pressure load was 80 to 500 g/cm$^2$, and the first surface was brought into contact with a polishing cloth for polishing. At this time, the obtained surface roughness Ra of the first surface was a mirror state of 0.1 to 0.2 nm. By the above-described method, sample Nos. 1 to 4 of the present example and sample Nos. 5 to 8 of the comparative example were obtained.

Measurements of arithmetic mean roughness (Ra), maximum height (Rmax), mean spacing (S) of local peaks, and mean spacing (Sm) of irregularities on a second surface of each sample obtained were carried out by surface roughness measuring instrument SE1700a made by Kosaka Laboratory Ltd.

Sample No. 1 had an arithmetic mean roughness (Ra) of 0.2 µm to 0.4 µm, and the relationship between the arithmetic mean roughness (Ra) and mean spacing (S) of local peaks was Ra/S≥11.

Sample No. 2 had an arithmetic mean roughness (Ra) of 0.2 µm to 0.4 µm, and the relationship between the arithmetic mean roughness (Ra) and mean spacing (Sm) of irregularities was Ra/Sm≥6.7.

Sample No. 3 had a maximum height (Rmax) of 2.5 µm to 4.5 µm, and the relationship between the maximum height (Rmax) and mean spacing (S) of local peaks was Rmax/S≥130.

Sample No. 4 had a maximum height (Rmax) of 2.5 µm to 4.5 µm, and the relationship between the maximum height (Rmax) and mean spacing (Sm) of irregularities was Rmax/Sm 80.

Sample No. 5, which is a comparative example corresponding to sample No. 1, had an arithmetic mean roughness (Ra) of 0.2 µm to 0.4 µm, and the relationship between the arithmetic mean roughness (Ra) and mean spacing (S) of local peaks was Ra/S<11.

Sample No. 6, which is a comparative example corresponding to sample No. 2, had an arithmetic mean roughness (Ra) of 0.2 µm to 0.4 µm, and the relationship between the arithmetic mean roughness (Ra) and mean spacing (Sm) of irregularities was Ra/Sm<6.7.

Sample No. 7, which is a comparative example corresponding to sample No. 3, had a maximum height (Rmax) of 2.5 µm to 4.5 µm, and the relationship between the maximum height (Rmax) and mean spacing (S) of local peaks was Rmax/S<130.

Sample No. 8, which is a comparative example corresponding to sample No. 4, had a maximum height (Rmax) of 2.5 µm to 4.5 µm, and the relationship between the maximum height (Rmax) and mean spacing (Sm) of irregularities was Rmax/Sm<80.

Samples Nos. 1 to 4 had less reflected waves from the second surface as compared to the respective corresponding sample Nos. 5 to 8, and had less warpage or cracks that are considered to be caused by defects or residual stress due to roughening.

The invention claimed is:

1. A substrate for a surface acoustic wave device, the substrate constituted of a piezoelectric material and comprising:
   a first surface on which a surface acoustic wave propagates, and
   a second surface located opposite to the first surface, wherein
   the second surface has an arithmetic mean roughness (Ra) of 0.2 µm to 0.4 µm, and a relationship between the arithmetic mean roughness Ra and mean spacing (S) of local peaks is Ra/S≥11.

2. The substrate for a surface acoustic wave device according to claim 1, wherein the mean spacing (S) of local peaks is 0.0015 µm to 0.025 µm.

3. The substrate for a surface acoustic wave device according to claim 1, wherein the piezoelectric material is a lithium tantalate single crystal.

4. The substrate for a surface acoustic wave device according to claim 1, wherein the substrate for a surface acoustic wave device is a 36° Y to 46° Y lithium tantalate single crystal.

5. A pseudo surface acoustic wave element comprising the substrate for a surface acoustic wave device according to claim 1 as a substrate.

6. A substrate for a surface acoustic wave device, the substrate constituted of a piezoelectric material and comprising:
   a first surface on which a surface acoustic wave propagates, and
   a second surface located opposite to the first surface, wherein
   the second surface has an arithmetic mean roughness (Ra) of 0.2 µm to 0.4 µm, and a relationship between the arithmetic mean roughness (Ra) and mean spacing (Sm) of irregularities is Ra/Sm≥6.7.

7. The substrate for a surface acoustic wave device according to claim 6, wherein the mean spacing (Sm) of irregularities is 0.03 µm to 0.05 µm.

8. A substrate for a surface acoustic wave device, the substrate constituted of a piezoelectric material and comprising:
   a first surface on which a surface acoustic wave propagates, and
   a second surface located opposite to the first surface, wherein
   the second surface has a maximum height (Rmax) of 2.5 µm to 4.5 µm, and a relationship between the maximum height (Rmax) and mean spacing (S) of local peaks is Rmax/S≥130.

9. The substrate for a surface acoustic wave device according to claim 8, wherein the mean spacing (S) of local peaks is 0.0015 µm to 0.025 µm.

10. A substrate for a surface acoustic wave device, the substrate constituted of a piezoelectric material and comprising:
    a first surface on which a surface acoustic wave propagates, and
    a second surface located opposite to the first surface, wherein
    the second surface has a maximum height (Rmax) of 2.5 µm to 4.5 µm, and a relationship between the maximum height (Rmax) and mean spacing (Sm) of irregularities is Rmax/Sm≥80.

11. The substrate for a surface acoustic wave device according to claim 10, wherein the mean spacing (Sm) of irregularities is 0.03 µm to 0.05 µm.

* * * * *